United States Patent
Zhu et al.

(10) Patent No.: US 12,550,346 B2
(45) Date of Patent: Feb. 10, 2026

(54) REVERSE-CONDUCTING IGBT CHIP

(71) Applicant: ZHUZHOU CRRC TIMES SEMICONDUCTOR CO., LTD., Hunan (CN)

(72) Inventors: Liheng Zhu, Hunan (CN); Haihui Luo, Hunan (CN); Qiang Xiao, Hunan (CN); Rongzhen Qin, Hunan (CN); Mengjie Wang, Hunan (CN)

(73) Assignee: ZHUZHOU CRRC TIMES SEMICONDUCTOR CO., LTD., Zhuzhou (CN)

( * ) Notice: Subject to any disclaimer, the term of this patent is extended or adjusted under 35 U.S.C. 154(b) by 465 days.

(21) Appl. No.: 18/022,499

(22) PCT Filed: Aug. 23, 2021

(86) PCT No.: PCT/CN2021/114069
§ 371 (c)(1),
(2) Date: Feb. 21, 2023

(87) PCT Pub. No.: WO2022/042481
PCT Pub. Date: Mar. 3, 2022

(65) Prior Publication Data
US 2024/0038878 A1 Feb. 1, 2024

(30) Foreign Application Priority Data
Aug. 25, 2020 (CN) .......................... 202010864142.8

(51) Int. Cl.
*H10D 12/00* (2025.01)
*H10D 62/10* (2025.01)

(52) U.S. Cl.
CPC ......... *H10D 12/441* (2025.01); *H10D 62/105* (2025.01); *H10D 62/127* (2025.01)

(58) Field of Classification Search
CPC .. H10D 12/441; H10D 62/105; H10D 62/127; H10D 8/00; H10D 12/481; H10D 62/8325; H10D 62/106; H10D 62/142; H10D 62/10; H10D 62/124; H10D 12/411
USPC .......................................... 257/139
See application file for complete search history.

(56) References Cited

U.S. PATENT DOCUMENTS

| 10,103,227 B2 * | 10/2018 | Huesken ............ H10D 12/411 |
| 2005/0017290 A1 * | 1/2005 | Takahashi .......... H10D 12/441 257/E29.198 |
| 2007/0215981 A1 * | 9/2007 | Schulze ................ H10D 18/01 257/E21.388 |

(Continued)

FOREIGN PATENT DOCUMENTS

| CN | 101877352 A | | 11/2010 | |
| CN | 109728085 A | * | 5/2019 | |
| JP | 2005057235 A | * | 3/2005 | ........... H10D 30/668 |

*Primary Examiner* — Mohammad M Hoque

(57) ABSTRACT

Provided is a reverse-conducting IGBT chip including a first conductive type substrate; and several first conductive type short circuit regions arranged at intervals below the substrate and adjacent to a collector region. The short circuit regions are located outside a first preset range having the center of a chip as a center, in a second preset range outside the first preset range and having the center of the chip as a center, in a third preset range outside the second preset range and having the center of the chip as a center, and in a range outside the third preset range and enclosed by a chip edge.

7 Claims, 3 Drawing Sheets

(56) References Cited

U.S. PATENT DOCUMENTS

| | | | | |
|---|---|---|---|---|
| 2010/0258840 | A1* | 10/2010 | Schulze | H10D 62/141 |
| | | | | 257/E29.197 |
| 2010/0276727 | A1* | 11/2010 | Storasta | H10D 62/142 |
| | | | | 257/133 |
| 2012/0132954 | A1* | 5/2012 | Kouno | H10D 12/481 |
| | | | | 257/140 |
| 2017/0263785 | A1* | 9/2017 | Masuoka | H10D 64/23 |
| 2018/0226487 | A1* | 8/2018 | Oota | H10D 12/461 |
| 2022/0013635 | A1* | 1/2022 | Tamura | H10D 8/422 |

\* cited by examiner

REVERSE-CONDUCTING IGBT CHIP

This present disclosure claims the priority of Chinese patent application CN 202010864142.8, entitled "Reverse-Conducting IGBT Chip" and filed on Aug. 25, 2020, the entirety of which is incorporated herein by reference.

FIELD OF THE INVENTION

The present disclosure relates to the technical field of semiconductor devices, and in particular, to a reverse-conducting IGBT chip.

BACKGROUND OF THE INVENTION

An insulated gate bipolar transistor (IGBT) chip is not conductive reversely, and thus a fast recovery diode (FRD) of a corresponding specification is usually required to connected inversely in parallel to the IGBT chip for protecting IGBT chip by freewheeling in actual applications. Generally, an IGBT and an FRD are packaged into one module, resulting in problems in terms of package cost, module area, and chip cooling. Thus, in order to eliminate the defect, reduce the cost, and increase the power density of the chip, the IGBT and the FRD are usually integrated on one chip in a process to form a reverse-conducting IGBT chip.

A traditional reverse-conducting IGBT 100 has a structure as shown in FIG. 1, which includes a substrate 101, a drift layer 102, a collector region 103, and a short circuit region 104, the drift layer 102 including a cell region 1021 and a terminal region 1022. In the early stage of forward conducting, since a PN junction between the collector region and the substrate is short-circuited and holes cannot be injected from the collector region to the drift layer, in this case there is only electron current in the IGBT and the on-resistance of the IGBT is very large. When a device operates in a vertical double-diffused metal oxide semiconductor field effect transistor (VDMOS) mode, the PN junction is forward biased as the voltage increases, and holes start to be injected from the collector region into the drift layer for forming conductivity modulation. When a device operates in an IGBT mode, a phenomenon that the current gradually increases while the voltage decreases, i.e., a voltage snap-back phenomenon, occurs, and a secondary voltage snap-back phenomenon may even appear.

SUMMARY OF THE INVENTION

Aiming at the above problem, the present disclosure provides a reverse-conducting IGBT chip, which solves the technical problem of the existence of the voltage snap-back phenomenon in a reverse-conducting IGBT chip in existing technology.

The present disclosure provides a reverse-conducting IGBT chip, and the reverse-conducting IGBT chip includes: a first conductive type substrate; a first conductive type drift layer above the substrate, the drift layer including a cell region and a terminal region around the cell region; a second conductive type collector region below the substrate; and several first conductive type short circuit regions which are provided at an interval below the substrate and are adjacent to the collector region. The short circuit region is located outside a first preset range having a center of the chip as a center; in a second preset range outside the first preset range and having the center of the chip as a center, a ratio of a total area of the short circuit regions to an area of the collector region is a first preset threshold value; in a third preset range outside the second preset range and having the center of the chip as a center, a ratio of a total area of the short circuit regions to an area of the collector region is a second preset threshold value; in a range outside the third preset range and enclosed by a chip edge, a ratio of a total area of the short circuit regions to an area of the collector region is a third preset threshold value; and the first preset threshold value is less than the second preset threshold value, and the second preset threshold value is less than the third preset threshold value.

According to an embodiment of the present disclosure, a size of the first preset range is selected to be able to eliminate a primary voltage snap-back phenomenon of the chip; and a size of the second preset range and a size of the third preset range, as well as the first preset threshold value, the second preset threshold value, and the third preset threshold value are selected to able to eliminate a secondary voltage snap-back phenomenon of the chip.

According to an embodiment of the present disclosure, the chip is a chip of a square; and each of the first preset range, the second preset range, and the third preset range has a shape of a square.

According to an embodiment of the present disclosure, a side length of the first preset range is calculated by the following calculation formula:

$$a = 2W = 2 \times C \times \sqrt{L \times Q/ND},$$

where a is the side length of the first preset range; W is a half of the side length of the first preset range; C is a constant number, and is in a range from $\sqrt{3}$ to $2\sqrt{2}$; L is a thickness of the chip; Q is an ion implantation dosage of the substrate; and ND is an ion doping concentration of the drift layer; a side length of the second preset range is calculated by the following calculation formula:

$$b = 2\left(W + \frac{X - W}{3}\right),$$

where b is the side length of the second preset range, and X is a half of a side length of the chip; and a side length of the third preset range is calculated by the following calculation formula:

$$c = 2\left(W + \frac{X - W}{3} \times 2\right),$$

where c is the side length of the third preset range.

According to an embodiment of the present disclosure, a side length of the first preset range is calculated by the following calculation formula:

$$a = 2W = 2 \times C \times \sqrt{L \times Q/ND},$$

where a is the side length of the first preset range; W is a half of the side length of the first preset range; C is a constant number, and is in a range from $\sqrt{3}$ to $2\sqrt{2}$; L is a thickness of the chip; Q is an ion implantation dosage of the substrate; and ND is an ion doping concentration of the drift layer; a side length of the second preset range is calculated by the following calculation formula:

$$b = 2\left(W + \frac{X - W}{2}\right),$$

where b is the side length of the second preset range, and X is a half of a side length of the chip; and a side length of the third preset range is calculated by the following calculation formula:

$$c = 2\left(W + \frac{X-W}{2} + \frac{X-W}{3}\right),$$

where c is the side length of the third preset range.

According to an embodiment of the present disclosure, the chip is a chip of a square; and each of the first preset range, the second preset range, and the third preset range is circular.

According to an embodiment of the present disclosure, a radius of the first preset range is calculated by the following calculation formula:

$$W = C \times \sqrt{L \times Q/ND},$$

where W is the radius of the first preset range; C is a constant number, and is in a range from $\sqrt{3}$ to $2\sqrt{2}$; L is a thickness of the chip; Q is an ion implantation dosage of the substrate; and ND is an ion doping concentration of the drift layer; a radius of the second preset range is calculated by the following calculation formula:

$$b = W + \frac{X-W}{3},$$

where b is the radius of the second preset range, and X is a half of a side length of the chip; and a radius of the third preset range is calculated by the following calculation formula:

$$c = W + \frac{X-W}{3} \times 2,$$

where c is the radius of the third preset range.

According to an embodiment of the present disclosure, a radius of the first preset range is calculated by the following calculation formula:

$$W = C \times \sqrt{L \times Q/ND},$$

where W is the radius of the first preset range; C is a constant number, and is in a range from $\sqrt{3}$ to $2\sqrt{2}$; L is a thickness of the chip; Q is an ion implantation dosage of the substrate; and ND is an ion doping concentration of the drift layer; a radius of the second preset range is calculated by the following calculation formula:

$$b = W + \frac{X-W}{2},$$

where b is the radius of the second preset range, and X is a half of a side length of the chip; and a radius of the third preset range is calculated by the following calculation formula:

$$c = W + \frac{X-W}{2} + \frac{X-W}{3},$$

where c is the radius of the third preset range.

According to an embodiment of the present disclosure, the first preset threshold value is in a range from 0.1 to 0.3.

According to an embodiment of the present disclosure, the second preset threshold value is calculated by the following calculation formula:

$$s = K \times r,$$

where s is the second preset threshold value; K is a constant number, and is in a range from 1.1 to 2.0; and r is the first preset threshold; and the third preset threshold value is calculated by the following calculation formula:

$$t = K^2 \times r,$$

where t is the third preset threshold value.

By adopting the above technical solutions, at least the following technical effects can be achieved:

(1) by providing a large-area collector region at a central position of a chip, a device can be turned on in the early stage of conducting when the current and the voltage are very small, so that a primary voltage snap-back phenomenon can be eliminated effectively.

(2) by reasonably designing sizes of different preset ranges and corresponding area ratios of a short circuit regions and a collector region, continuous expansion of a hole injection region during conducting can be ensured, thereby eliminating a secondary voltage snap-back phenomenon, and a proportion of an IGBT part and a proportion of an FRD part in the device can be controlled, thereby reducing a total loss of the device in different working modes (e.g., an IGBT mode and an FRD mode) and improving a safe working region and robustness of the device.

(3) increasing of a total area of a short circuit regions at a corresponding position below a terminal region of the chip (a position close to a chip edge) can effectively reduce injection efficiency of an anode, decrease parasitic PNP transistors, and reduce the bipolar gain, thereby reducing a high-temperature leakage current of the device and improving the reliability of the device.

BRIEF DESCRIPTION OF THE DRAWINGS

The accompanying drawings are provided for further understanding of the present disclosure, constitute a part of the description, and are used to explain the present disclosure together with the following specific embodiments, but do not constitute any limitation to the present disclosure. In the drawings.

In the accompanying drawings, same reference numerals are used for same components. The accompanying drawings are not drawn according to actual scale.

DETAILED DESCRIPTION OF THE EMBODIMENTS

Figure 1:
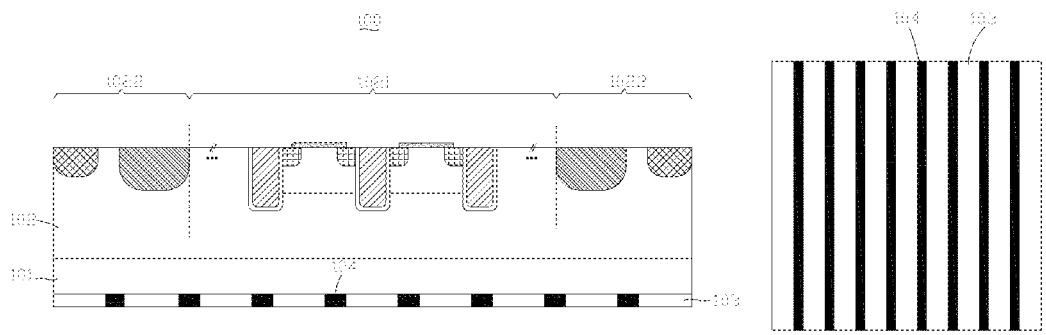
FIG. 1 schematically shows a sectional structure and a back surface structure of a traditional reverse-conducting IGBT chip with a trench gate structure.

The present disclosure will be explained in detail with reference to the accompanying drawings and the embodiments, whereby it can be fully understood how to solve the technical problem by the technical means according to the present disclosure and achieve the corresponding technical effects thereof, and thus the technical solution according to the present disclosure can be implemented. As long as there is no conflict, the embodiments in the present disclosure and the technical features mentioned in the embodiments may be combined with one another, and the technical solutions obtained all fall within the protection scope of the present disclosure. In the accompanying drawings, for clarity, sizes and relative dimensions of layers and regions may be exaggerated, and same reference numerals represent same elements throughout the drawings.

It should be understood that, although terms such as "first", "second", and "third" may be used to describe various elements, components, regions, layers, and/or parts, these elements, components, regions, layers, and/or parts shall not be limited by these terms. These terms are used only to differentiate one element, component, region, layer, or part from another element, component, region, layer, or part. Therefore, without departing from teachings of the present disclosure, a first element, component, region, layer, or part discussed below may be referred to as a second element, component, region, layer, or part.

It should be understood that, terms indicating spatial relationships such as "above", "on", "below", and "under" may be used for the convenience of description herein, so as to describe a relationship of one element or feature and another element or feature as shown in the drawings. It should be understood that, in addition to an orientation shown in the drawings, a term indicating a spatial relationship intends to further include a different orientation of a device in use and operation. For example, if a device in the drawing is inverted, an element or feature described as "below another element" may have an orientation described as "above" another element or feature. Therefore, each of exemplary terms "below" and "under" may include two orientations. That is, "below" includes orientations of "below" and "above", and "under" includes orientations of "under" and "on". A device may be oriented in another manner (rotated by 90 degrees or orientated otherwise), and a term describing the special relationship used herein would be explained correspondingly.

Terms used herein intend to describe specific embodiments only, and do not intend to limit the present disclosure. When used herein, the singular forms "a", "an" and "the/said" are intended to include the plural forms as well, unless the context clearly indicates otherwise. It should also be understood that, terms "compose" and/or "include", when used in the description, indicate the existence of the feature, integer, step, operation, element and/or component, but do not exclude the existence or addition of one or more other features, integers, steps, operations, elements, components and/or groups. When used herein, the expression "and/or" includes any or all combinations of relevant listed items.

Embodiments of the present disclosure are described herein with reference to schematic cross-sectional views of ideal embodiments (and intermediate structures) of the present disclosure. In this way, variations from a shape shown due to the preparation technology and/or tolerance can be anticipated. Therefore, embodiments of the present disclosure shall not be limited to a specific shape of a region shown herein, but include a shape deviation caused by the preparation, for example. For example, an implantation region shown as a rectangle may usually have, at its edge, a round or curved feature and/or an implantation concentration gradient, rather than a binary change from an implantation region to a non-implantation region. Likewise, for a buried region formed by implantation, there may be implantation in a region between the buried region and a surface passed by when the implantation is performed. Therefore, regions shown in the drawings are substantively schematic, and their shapes do not intend to show actual shapes of regions of a device and do not intend to limit the scope of the present disclosure.

In order to thoroughly understand the present disclosure, detailed structures and steps are provided in the following description, so as to interpret technical solutions of the present disclosure. Preferred embodiments of the present disclosure are described in detail as follows, but the present disclosure may have other embodiments in addition to the detailed description.

Embodiment One

Figure 2:
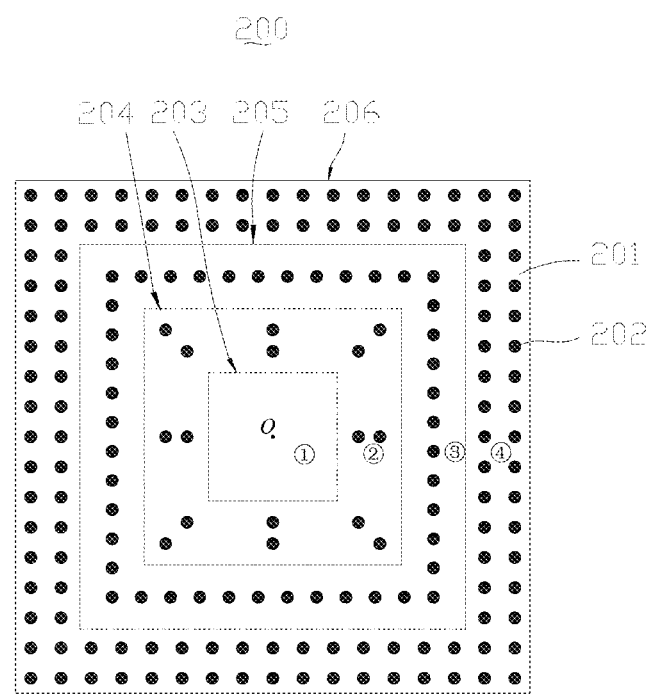
FIG. 2 schematically shows a back surface structure of a reverse-conducting IGBT chip according to an embodiment of the present disclosure.

As shown in FIG. 2, the present embodiment provides a reverse-conducting IGBT chip 200, which includes a substrate (not shown in the figures), a drift layer (not shown in the figures), a collector region 201, and a short circuit region 202.

The reverse-conducting IGBT chip 200 is a chip of a square.

Exemplarily, the substrate is a first conductive type silicon carbide substrate, and when a first conductive type is an N type, doped ions may be hydrogen, phosphorus, strontium or sulfur.

The drift layer is a first conductive type drift layer, and is located above the substrate (i.e., on a side of the substrate). An ion doping concentration and a thickness of the drift layer is adjusted according to a withstand voltage of the chip.

The drift layer includes a cell region (not shown in the figures) and a terminal region (not shown in the figures), and the terminal region is located around the cell region.

The collector region 201 is a second conductive type collector region 201, and the collector region 201 is located below the substrate (i.e., on the other side of the substrate).

The short circuit region 202 is a first conductive type short circuit region 202. Several short circuit regions 202 are provided at an interval below the substrate, and the collector region 201 is adjacent to the short circuit region 202. The short circuit region 202 has a shape of a circle, an equilateral polygon, or a rectangle, and the short circuit region 202 has a size of less than 200 μM.

The short circuit region 202 is located outside a first preset range 203 having a center O of the chip as a center. That is, there is no short circuit region 202 in the first preset range 203 (i.e., region ①).

In a second preset range 204 outside the first preset range 203 and having the center O of the chip as a center (i.e., region ②), a ratio of a total area of the short circuit regions 202 to an area of the collector region 201 is a first preset threshold value r.

In a third preset range 205 outside the second preset range 204 and having the center O of the chip as a center (i.e., region ③), a ratio of a total area of the short circuit regions 202 to an area of the collector region 201 is a second preset threshold value s.

In a range outside the third preset range 205 and enclosed by a chip edge 206 (i.e., region ④), a ratio of a total area of the short circuit regions 202 to an area of the collector region 201 is a third preset threshold value t.

The first preset threshold value r is less than the second preset threshold value s, and the second preset threshold value s is less than the third preset threshold value t, that is, the first preset threshold value r<the second preset threshold value s<the third preset threshold value t.

Specifically, a size of the first preset range 203 is selected to be able to eliminate a primary voltage snap-back phenomenon of the chip. A size of the second preset range 204 and a size of the third preset range 205, as well as the first preset threshold value, the second preset threshold value, and the third preset threshold value are selected to able to eliminate a secondary voltage snap-back phenomenon of the chip.

In the present embodiment, each of the first preset range 203, the second preset range 204, and the third preset range 205 has a shape of a square.

A side length of the first preset range 203 is calculated by the following calculation formula:

$$a = 2W = 2 \times C \times \sqrt{L \times Q/ND},$$

where a is the side length of the first preset range 203; W is a half of the side length of the first preset range 203; C is a constant number, and is in a range from $\sqrt{3}$ to $2\sqrt{2}$; L is a thickness of the chip; Q is an ion implantation dosage (in $cm^{-2}$) of the substrate; and ND is an ion doping concentration (in $cm^{-3}$) of the drift layer. The first preset range 203 of this size can be used to eliminate the primary voltage snap-back phenomenon of the chip during conducting. A large-area collector region 201 at a position of the center O of the chip (no short circuit region 202 therein) forms a main IGBT region (i.e., a pilot region). In this way, in the early stage of conducting, the main IGBT region is first turned on and generates conductivity modulation, and a current density is increased, so that a device can be turned on in the early stage of conducting when the current and the voltage are very small, thereby effectively eliminating the primary voltage snap-back phenomenon.

A side length of the second preset range 204 is calculated by the following calculation formula:

$$b = 2\left(W + \frac{X - W}{3}\right),$$

where b is the side length of the second preset range 204, and X is a half of the side length of the chip.

A side length of the third preset range 205 is calculated by the following calculation formula:

$$c = 2\left(W + \frac{X - W}{3} \times 2\right),$$

where c is the side length of the third preset range 205.

That is, in the present embodiment, a distance from the first preset range 203 to the second preset range 204, a distance from the second preset range 204 to the third preset range 205, and a distance from the third preset range 205 to the chip edge 206 are equal to each other.

The first preset threshold value r (i.e., the ratio of the total area of the short circuit regions 202 to the area of the collector region 201 in the region ②) is in a range from 0.1 to 0.3.

The second preset threshold value s (i.e., the ratio of the total area of the short circuit regions 202 to the area of the collector region 201 in the region ③) is calculated by:

$$s = K \times r,$$

where s is the second preset threshold value; K is a constant number, and is in a range from 1.1 to 2.0; and r is the first preset threshold.

The third preset threshold value t (i.e., the ratio of the total area of the short circuit regions 202 to the area of the collector region 201 in the region ④) is calculated by:

$$t = K^2 \times r,$$

where t is the third preset threshold value.

That is, along the region ②, via the region ③, to the region ④, the ratio of the total area of the short circuit regions 202 to the area of the collector region 201 is proportionally increased.

In the present embodiment, by reasonably designing sizes of different preset ranges and preset threshold values (of area ratios of the short circuit regions 202 and the collector region 201), continuous expansion of a hole injection region during conducting can be ensured, thereby controlling a proportion of an IGBT part and a proportion of an FRD part in the device while eliminating the secondary voltage snap-back phenomenon (caused by mutational expansion of the hole injection region), so that a total loss of the device in different working modes (e.g., an IGBT mode and an FRD mode) can be reduced and a safe working region and robustness of the device can be improved.

Besides, in a range outside the third preset range 205 and enclosed by the chip edge 206 (i.e., region ④), the ratio of the total area of the short circuit regions 202 to the area of the collector region 201 (the third preset threshold value t) is greater than the ratios (the first preset threshold value r and the second preset threshold value s) of the total area of the short circuit regions 202 to the area of the collector region 201 of intermediate regions (i.e., the region ② and the region ③). That is, increasing of the area of the short circuit regions 202 at a corresponding position below the terminal region of the chip (a position close to the chip edge 206) can effectively reduce injection efficiency of an anode, decrease parasitic PNP transistors, and reduce the bipolar gain, thereby reducing a high-temperature leakage current of the device and enhancing the reliability of the device. A short circuit region 202 may even be introduced to a collector region below a terminal directly. That is, no collector region 201 is provided below the terminal region, and only the short circuit region 202 is provided.

In the present embodiment, the first conductive type is opposite to the second conductive type. For example, if the first conductive type is an N type, the second conductive type is a P type; and if the first conductive type is the P type, the second conductive type is the N type. Specifically, a reasonable selection may be made according to the type of the device to be prepared actually.

The present embodiment provides a reverse-conducting IGBT chip. By a reasonable and optimized design of a back surface structure of the reverse-conducting IGBT chip, uniform distribution of an IGBT region and an FRD region can be achieved, a total loss of the device in different working modes (of an IGBT mode and an FRD mode) can be reduced, and a safe working region and robustness of the device can be improved. Not only are primary and secondary voltage snap-back phenomena of a reverse-conducting IGBT chip solved, but also the injection efficiency of a terminal region of the reverse-conducting IGBT chip is reduced, thereby reducing a high-temperature leakage current of the device.

Embodiment Two

Figure 3:
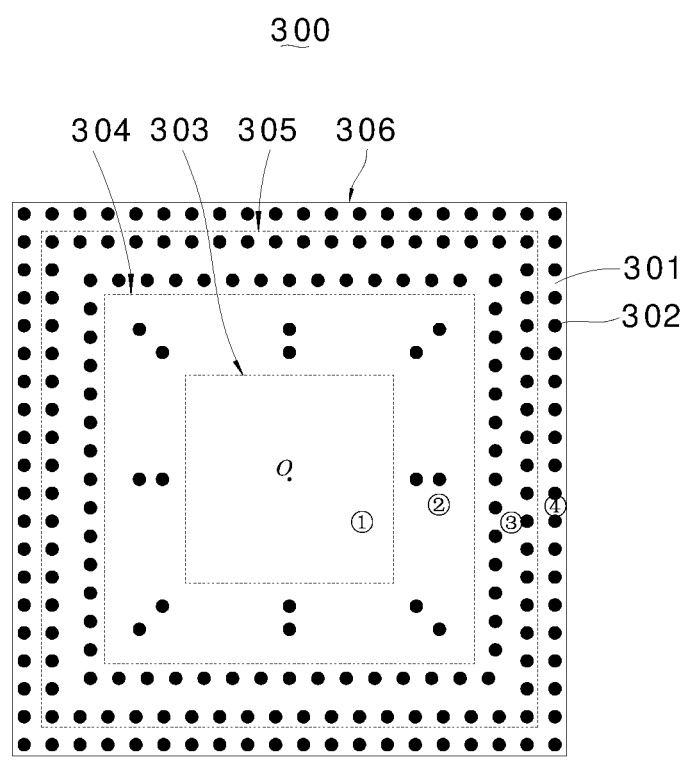
FIG. 3 schematically shows a back surface structure of another reverse-conducting IGBT chip according to an embodiment of the present disclosure.

As shown in FIG. 3, the present embodiment provides a reverse-conducting IGBT chip 300, which includes a substrate (not shown in the figures), a drift layer (not shown in the figures), a collector region 301, and a short circuit region 302.

The reverse-conducting IGBT chip 300 is a chip of a square.

Exemplarily, the substrate is a first conductive type silicon carbide substrate, and when a first conductive type is an N type, doped ions may be hydrogen, phosphorus, strontium or sulfur.

The drift layer is a first conductive type drift layer, and is located above the substrate. An ion doping concentration and a thickness of the drift layer is adjusted according to a withstand voltage of the chip.

The drift layer includes a cell region (not shown in the figures) and a terminal region (not shown in the figures), and the terminal region is located around the cell region.

The collector region 301 is a second conductive type collector region 301, and the collector region 301 is located below the substrate.

The short circuit region 302 is a first conductive type short circuit region 302. Several short circuit regions 302 are provided at an interval below the substrate, and the collector region 301 is adjacent to the short circuit region 302. The short circuit region 302 has a shape of a circle, an equilateral polygon, or a rectangle, and the short circuit region 302 has a size of less than 200 μM.

The short circuit region 302 is located outside a first preset range 303 having a center O of the chip as a center. That is, there is no short circuit region 302 in the first preset range 303 (i.e., region ①).

In a second preset range 304 outside the first preset range 303 and having the center O of the chip as a center (i.e., region ②), a ratio of a total area of the short circuit regions 302 to an area of the collector region 301 is a first preset threshold value r.

In a third preset range 305 outside the second preset range 304 and having the center O of the chip as a center (i.e., region ③), a ratio of a total area of the short circuit regions 302 to an area of the collector region 301 is a second preset threshold value s.

In a range outside the third preset range 305 and enclosed by a chip edge 306 (i.e., region ④), a ratio of a total area of the short circuit regions 302 to an area of the collector region 301 is a third preset threshold value t.

The first preset threshold value r is less than the second preset threshold value s, and the second preset threshold value s is less than the third preset threshold value t, that is, the first preset threshold value r<the second preset threshold value s<the third preset threshold value t.

Specifically, a size of the first preset range 303 is selected to be able to eliminate a primary voltage snap-back phenomenon of the chip. A size of the second preset range 304 and a size of the third preset range 305, as well as the first preset threshold value, the second preset threshold value, and the third preset threshold value are selected to able to eliminate a secondary voltage snap-back phenomenon of the chip.

In the present embodiment, each of the first preset range 303, the second preset range 304, and the third preset range 305 has a shape of a square.

A side length of the first preset range 303 is calculated by the following calculation formula:

$$a=2W=2\times C\times \sqrt[4]{L\times Q/ND},$$

where a is the side length of the first preset range 303; W is a half of the side length of the first preset range 303; C is a constant number, and is in a range from $\sqrt{3}$ to $2\sqrt{2}$; L is a thickness of the chip; Q is an ion implantation dosage (in cm$^{-2}$) of the substrate; and ND is the ion doping concentration (in cm$^{-3}$) of the drift layer. The first preset range 303 of this size can eliminate the primary voltage snap-back phenomenon of the chip during conducting. A large-area collector region 301 provided at a position of the center O of the chip (there is no short circuit region 302) forms a main IGBT region (i.e., a pilot region). In this way, in the early stage of conducting, the main IGBT region is first turned on and generates conductivity modulation, and a current density is increased, so that a device can be turned on in the early stage of conducting when the current and the voltage are very small, thereby effectively eliminating the primary voltage snap-back phenomenon.

A side length of the second preset range 304 is calculated by the following calculation formula:

$$b = 2\left(W + \frac{X-W}{2}\right),$$

where b is the side length of the second preset range 304, and X is a half of the side length of the chip.

A side length of the third preset range 305 is calculated by the following calculation formula:

$$c = 2\left(W + \frac{X-W}{2} + \frac{X-W}{3}\right),$$

where c is the side length of the third preset range 305.

That is, in the present embodiment, a distance from the first preset range 303 to the second preset range 304, a distance from the second preset range 304 to the third preset range 305, and a distance from the third preset range 305 to a chip edge 306 are gradually reduced.

The first preset threshold value r (i.e., the ratio of the total area of the short circuit regions 302 to the area of the collector region 301 in the region ②) is in a range from 0.1 to 0.3.

The second preset threshold value s (i.e., the ratio of the total area of the short circuit regions 302 to the area of the collector region 301 in the region ③) is calculated by the following calculation formula:

$$s=K\times r,$$

where s is the second preset threshold value; K is a constant number, and is in a range from 1.1 to 2.0; and r is the first preset threshold.

The third preset threshold value t (i.e., the ratio of the total area of the short circuit regions 302 to the area of the collector region 301 in the region ④) is calculated by the following calculation formula:

$$t=K^2\times r,$$

where t is the third preset threshold value.

That is, along the region ②, via the region ③, to the region ④, the ratio of the total area of the short circuit regions 302 to the area of the collector region 301 is proportionally increased.

In the present embodiment, by reasonably designing sizes of different preset ranges and preset threshold values of (area ratios of the short circuit region 302 and the collector region 301), continuous expansion of a hole injection region during conducting can be ensured, thereby controlling a proportion of an IGBT part and a proportion of an FRD part in the device while eliminating a secondary voltage snap-back phenomenon (caused by mutational expansion of the hole injection region), so that a total loss of the device in different working modes (e.g., an IGBT mode and an FRD mode) can be reduced and a safe working region and robustness of the device can be improved.

Besides, in a range outside the third preset range 305 and enclosed by the chip edge 306 (i.e., region ④), the ratio of the total area of the short circuit regions 302 to the area of the collector region 301 (the third preset threshold value t) is greater than ratios (the first preset threshold value r and the second preset threshold value s) of the total area of the short circuit regions 302 to the area of the collector region 301 of intermediate regions (i.e., the region ② and the region ③). That is, increasing of the area of the short circuit regions 302 at a corresponding position below the terminal region of the chip (a position close to the chip edge 306) can effectively reduce injection efficiency of an anode, decrease parasitic PNP transistors, and reduce the bipolar gain, thereby reducing a high-temperature leakage current of the device and enhancing the reliability of the device. A short circuit region 302 may even be introduced to a collector region below a terminal directly. That is, no collector region 301 is provided below the terminal region, and only the short circuit region 302 is provided.

In the present embodiment, the first conductive type is opposite to the second conductive type. For example, if the first conductive type is an N type, the second conductive type is a P type; and if the first conductive type is the P type, the second conductive type is the N type. Specifically, a reasonable selection may be made according to the type of the device to be prepared actually.

The present embodiment provides a reverse-conducting IGBT chip. By a reasonable and optimized design of a back surface structure of the reverse-conducting IGBT chip, uniform distribution of an IGBT region and an FRD region can be achieved, and a total loss of the device in different working modes (of an IGBT mode and an FRD mode) can be reduced, and a safe working region and robustness of the device can be improved. Not only are primary and secondary voltage snap-back phenomena of a reverse-conducting IGBT chip solved, but also the injection efficiency of a terminal region of the reverse-conducting IGBT chip is reduced, thereby reducing a high-temperature leakage current of the device.

Embodiment Three

Figure 4:
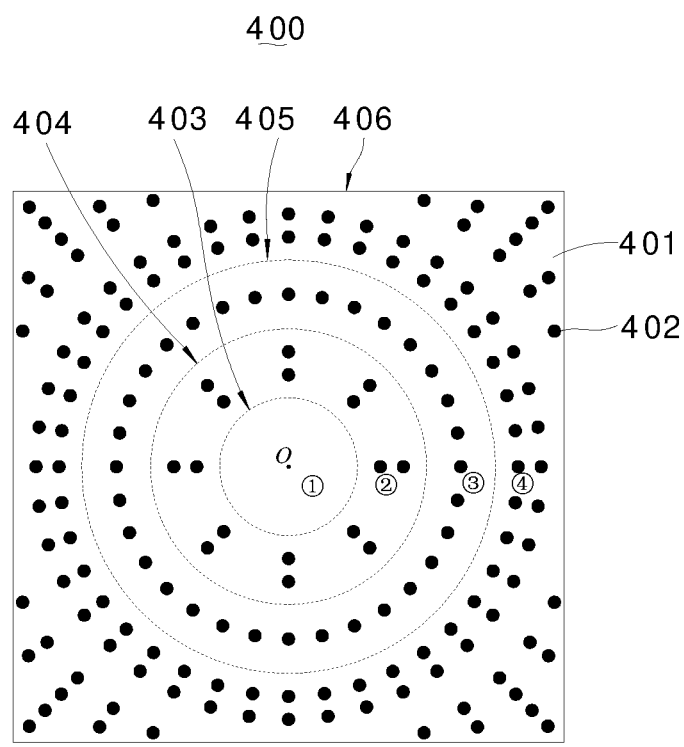
FIG. 4 schematically shows a back surface structure of another reverse-conducting IGBT chip according to an embodiment of the present disclosure.

As shown in FIG. 4, the present embodiment provides a reverse-conducting IGBT chip 400, which includes a substrate (not shown in the figures), a drift layer (not shown in the figures), a collector region 401, and a short circuit region 402.

The reverse-conducting IGBT chip 400 is a chip of a square.

Exemplarily, the substrate is a first conductive type silicon carbide substrate, and when a first conductive type is an N type, doped ions may be hydrogen, phosphorus, strontium or sulfur.

The drift layer is a first conductive type drift layer, and is located above the substrate. An ion doping concentration and a thickness of the drift layer is adjusted according to a withstand voltage of the chip.

The drift layer includes a cell region (not shown in the figures) and a terminal region (not shown in the figures), and the terminal region is located around the cell region.

The collector region 401 is a second conductive type collector region 401, and the collector region 401 is located below the substrate.

The short circuit region 402 is a first conductive type short circuit region 402. Several short circuit regions 402 are provided at an interval below the substrate, and the collector region 401 is adjacent to the short circuit region 402. The short circuit region 402 has a shape of a circle, an equilateral polygon, or a rectangle, and the short circuit region 402 has a size of less than 200 μm.

The short circuit region 402 is located outside a first preset range 403 having a center O of the chip as a center. That is, there is no short circuit region 402 in the first preset range 403 (i.e., region ①).

In a second preset range 404 outside the first preset range 403 and having the center O of the chip as a center (i.e., region ②), a ratio of a total area of the short circuit regions 402 to an area of the collector region 401 is a first preset threshold value r.

In a third preset range 405 outside the second preset range 404 and having the center O of the chip as a center (i.e., region ③), a ratio of a total area of the short circuit regions 402 to an area of the collector region 401 is a second preset threshold value s.

In a range outside the third preset range 405 and enclosed by a chip edge 406 (i.e., region ④), a ratio of a total area of the short circuit regions 402 to an area of the collector region 401 is a third preset threshold value t.

The first preset threshold value r is less than the second preset threshold value s, and the second preset threshold value s is less than the third preset threshold value t, that is, the first preset threshold value r<the second preset threshold value s<the third preset threshold value t.

Specifically, a size of the first preset range 403 is selected to be able to eliminate a primary voltage snap-back phenomenon of the chip. A size of the second preset range 404 and a size of the third preset range 405, as well as the first preset threshold value, the second preset threshold value, and the third preset threshold value are selected to able to eliminate a secondary voltage snap-back phenomenon of the chip.

In the present embodiment, each of the first preset range 403, the second preset range 404, and the third preset range 405 is circular.

A radius of the first preset range 403 is calculated by the following calculation formula:

$$W = C \times \sqrt{L \times Q/ND},$$

where W is the radius of the first preset range 403; C is a constant number, and is in a range from $\sqrt{3}$ to $2\sqrt{2}$; L is a thickness of the chip; Q is an ion implantation dosage (in cm 2) of the substrate; and ND is the ion doping concentration (in $cm^{-3}$) of the drift layer. The first preset range 403 of this size can eliminate the primary voltage snap-back phenomenon of the chip during conducting. A large-area collector region 401 provided at a position of the center O of the chip (there is no short circuit region 402) forms a main IGBT region (i.e., a pilot region). In this way, in the early stage of conducting, the main IGBT region is first turned on and generates conductivity modulation, and a current density is increased, so that a device can be turned on in the early stage of conducting when the current and the voltage are very small, thereby effectively eliminating the primary voltage snap-back phenomenon.

A radius of the second preset range 404 is calculated by the following calculation formula:

$$b = W + \frac{X - W}{3},$$

where b is the radius of the second preset range 404, and X is a half of the side length of the chip.

A radius of the third preset range 405 is calculated by the following calculation formula:

$$c = W + \frac{X - W}{3} \times 2,$$

where c is the radius of the third preset range 405.

That is, in the present embodiment, a distance from the first preset range 403 to the second preset range 404, a distance from the second preset range 404 to the third preset range 405, and a distance from the third preset range 405 to a chip edge 406 (a minimum distance) are equal to each other.

The first preset threshold value r (i.e., the ratio of the total area of the short circuit regions 402 to the area of the collector region 401 in the region ②) is in a range from 0.1 to 0.3.

The second preset threshold value s (i.e., the ratio of the total area of the short circuit regions 402 to the area of the collector region 401 in the region ③) is:

$$s = K \times r,$$

where s is the second preset threshold value; K is a constant number, and is in a range from 1.1 to 2.0; and r is the first preset threshold.

The third preset threshold value t (i.e., the ratio of the total area of the short circuit regions 402 to the area of the collector region 401 in the region ④) is:

$$t = K^2 \times r,$$

where t is the third preset threshold value.

That is, along the region ②, via the region ③, to the region ④, the ratio of the total area of the short circuit regions 402 to the area of the collector region 401 is proportionally increased.

In the present embodiment, by reasonably designing sizes of different preset ranges and preset threshold values (of area ratios of the short circuit regions 402 and the collector region 401), continuous expansion of a hole injection region during conducting can be ensured, thereby controlling a proportion of an IGBT part and a proportion of an FRD part in the device while eliminating the secondary voltage snap-back phenomenon (caused by mutational expansion of the hole injection region), so that a total loss of the device in different working modes (of an IGBT mode and an FRD mode) can be reduced and a safe working region and robustness of the device can be improved.

Besides, in a range outside the third preset range 405 and enclosed by the chip edge 406 (i.e., region ④), the ratio of the total area of the short circuit regions 402 to the area of the collector region 401 (the third preset threshold value t) is greater than ratios (the first preset threshold value r and the second preset threshold value s) of the total area of the short circuit regions 402 to the area of the collector region 401 of intermediate regions (i.e., the region ② and the region ③). That is, increasing of the area of the short circuit regions 402 at a corresponding position below the terminal region of the chip (a position close to the chip edge 406) can effectively reduce injection efficiency of an anode, decrease parasitic PNP transistors, and reduce the bipolar gain, thereby reducing a high-temperature leakage current of the device and enhancing the reliability of the device. A short circuit region 402 may even be introduced to a collector region below a terminal directly. That is, no collector region 401 is provided below the terminal region, and only the short circuit region 402 is provided.

In the present embodiment, the first conductive type is opposite to the second conductive type. For example, if the first conductive type is an N type, the second conductive type is a P type; and if the first conductive type is the P type, the second conductive type is the N type. Specifically, a reasonable selection may be made according to the type of the device to be prepared actually.

The present embodiment provides a reverse-conducting IGBT chip. By a reasonable and optimized design of a back surface structure of the reverse-conducting IGBT chip, uniform distribution of an IGBT region and an FRD region can be achieved, and a total loss of the device in different working modes (e.g., an IGBT mode and an FRD mode) can be reduced, and a safe working region and robustness of the device can be improved. Not only are primary and secondary voltage snap-back phenomena of a reverse-conducting IGBT chip solved, but also the injection efficiency of a terminal region of the reverse-conducting IGBT chip is reduced, thereby reducing a high-temperature leakage current of the device.

Embodiment Four

Figure 5:
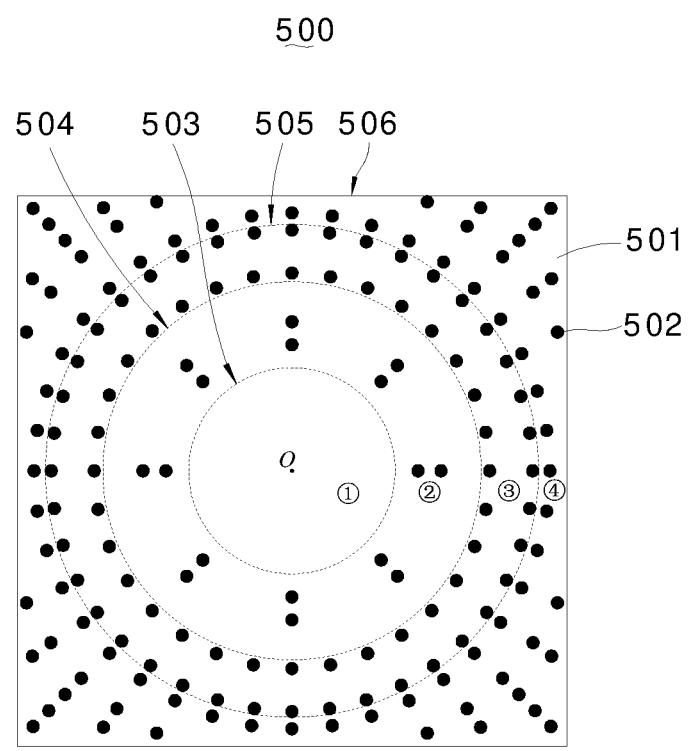
FIG. 5 schematically shows a back surface structure of another reverse-conducting IGBT chip according to an embodiment of the present disclosure.

As shown in FIG. 5, the present embodiment provides a reverse-conducting IGBT chip 500, which includes a substrate (not shown in the figures), a drift layer (not shown in the figures), a collector region 501, and a short circuit region 502.

The reverse-conducting IGBT chip 500 is a chip of a square.

Exemplarily, the substrate is a first conductive type silicon carbide substrate, and when a first conductive type is an N type, doped ions may be hydrogen, phosphorus, strontium or sulfur.

The drift layer is a first conductive type drift layer, and is located above the substrate. An ion doping concentration and a thickness of the drift layer is adjusted according to a withstand voltage of the chip.

The drift layer includes a cell region (not shown in the figures) and a terminal region (not shown in the figures), and the terminal region is located around the cell region.

The collector region 501 is a second conductive type collector region 501, and the collector region 501 is located below the substrate.

The short circuit region 502 is a first conductive type short circuit region 502. Several short circuit regions 502 are provided at an interval below the substrate, and the collector region 501 is adjacent to the short circuit region 502. The short circuit region 502 has a shape of a circle, an equilateral polygon, or a rectangle, and the short circuit region 502 has a size of less than 200 μm.

The short circuit region 502 is located outside a first preset range 503 having a center O of the chip as a center. That is, there is no short circuit region 502 in the first preset range 503 (i.e., region ①).

In a second preset range 504 outside the first preset range 503 and having the center O of the chip as a center (i.e., region ②), a ratio of a total area of the short circuit regions 502 to an area of the collector region 501 is a first preset threshold value r.

In a third preset range 505 outside the second preset range 504 and having the center O of the chip as a center (i.e., region ③), a ratio of a total area of the short circuit regions 502 to an area of the collector region 501 is a second preset threshold value s.

In a range outside the third preset range 505 and enclosed by a chip edge 506 (i.e., region ④), a ratio of a total area of the short circuit regions 502 to an area of the collector region 501 is a third preset threshold value t.

The first preset threshold value r is less than the second preset threshold value s, and the second preset threshold value s is less than the third preset threshold value t, that is, the first preset threshold value r<the second preset threshold value s<the third preset threshold value t.

Specifically, a size of the first preset range 503 is selected to be able to eliminate a primary voltage snap-back phenomenon of the chip. A size of the second preset range 504 and a size of the third preset range 505, as well as the first preset threshold value, the second preset threshold value, and the third preset threshold value are selected to able to eliminate a secondary voltage snap-back phenomenon of the chip.

In the present embodiment, each of the first preset range 503, the second preset range 504, and the third preset range 505 is circular.

A radius of the first preset range 503 is calculated by the following calculation formula:

$$W = C \times \sqrt{L \times Q/ND},$$

where W is the radius of the first preset range 503; C is a constant number, and is in a range from $\sqrt{3}$ to $2\sqrt{2}$; L is a thickness of the chip; Q is an ion implantation dosage (in cm 2) of the substrate; and ND is the ion doping concentration (in cm$^{-3}$) of the drift layer. The first preset range 503 of this size can eliminate the primary voltage snap-back phenomenon of the chip during conducting. A large-area collector region 501 provided at a position of the center O of the chip (there is no short circuit region 502) forms a main IGBT region (i.e., a pilot region). In this way, in the early stage of conducting, the main IGBT region is first turned on and generates conductivity modulation, and a current density is increased, so that a device can be turned on in the early stage of conducting when the current and the voltage are very small, thereby effectively eliminating the primary voltage snap-back phenomenon.

A radius of the second preset range 504 is calculated by the following calculation formula:

$$b = W + \frac{X - W}{2},$$

where b is the radius of the second preset range 504, and X is a half of a side length of the chip.

A radius of the third preset range 505 is calculated by the following calculation formula:

$$c = W + \frac{X - W}{2} + \frac{X - W}{3},$$

where c is the radius of the third preset range 505.

That is, in the present embodiment, a distance from the first preset range 503 to the second preset range 504, a distance from the second preset range 504 to the third preset range 505, and a distance from the third preset range 505 to a chip edge 506 (a minimum distance) are gradually decreased in sequence.

The first preset threshold value r (i.e., the ratio of the total area of the short circuit regions 502 to the area of the collector region 501 in the region ②) is in a range from 0.1 to 0.3.

The second preset threshold value s (i.e., the ratio of the total area of the short circuit regions 502 to the area of the collector region 501 in the region ③) is:

$$s = K \times r,$$

where s is the second preset threshold value; K is a constant number, and is from 1.1 to 2.0; and r is the first preset threshold.

The third preset threshold value t (i.e., the ratio of the total area of the short circuit regions 502 to the area of the collector region 501 in the region ④) is:

$$t = K^2 \times r,$$

where t is the third preset threshold value.

That is, along the region ②, via the region ③, to the region ④, the ratio of the total area of the short circuit regions 502 to the area of the collector region 501 is proportionally increased.

In the present embodiment, by reasonably designing sizes of different preset ranges and preset threshold values (of area ratios of the short circuit regions 502 and the collector region 501), continuous expansion of a hole injection region during conducting can be ensured, thereby controlling a proportion of an IGBT part and a proportion of an FRD part in the device while eliminating the secondary voltage snap-back phenomenon (caused by mutational expansion of the hole injection region), so that a total loss of the device in different working modes (an IGBT mode and an FRD mode) can be reduced and a safe working region and robustness of the device can be improved.

Besides, in a range outside the third preset range 505 and enclosed by the chip edge 506 (i.e., region ④), the ratio of the total area of the short circuit regions 502 to the area of the collector region 501 (the third preset threshold value t) is greater than ratios (the first preset threshold value r and the second preset threshold value s) of the total area of the short circuit regions 502 to the area of the collector region 501 of intermediate regions (i.e., the region ② and the region ③). That is, increasing of the area of the short circuit regions 502 at a corresponding position below the terminal region of the chip (a position close to the chip edge 506) can effectively reduce injection efficiency of an anode, decrease parasitic PNP transistors, and reduce the bipolar gain, thereby reducing a high-temperature leakage current of the device and enhancing the reliability of the device. A short circuit region 502 may even be introduced to a collector region below a terminal directly. That is, no collector region 501 is provided below the terminal region, and only the short circuit region 502 is provided.

In the present embodiment, the first conductive type is opposite to the second conductive type. For example, if the first conductive type is an N type, the second conductive type is a P type; and if the first conductive type is the P type, the second conductive type is the N type. Specifically, a reasonable selection may be made according to the type of the device to be prepared actually.

The present embodiment provides a reverse-conducting IGBT chip. By a reasonable and optimized design of a back surface structure of the reverse-conducting IGBT chip, uniform distribution of an IGBT region and an FRD region can be achieved, and a total loss of the device in different working modes (of an IGBT mode and an FRD mode) can be reduced, and a safe working region and robustness of the device can be improved. Not only are primary and secondary voltage snap-back phenomena of a reverse-conducting IGBT chip solved, but also the injection efficiency of a terminal region of the reverse-conducting IGBT chip is reduced, thereby reducing a high-temperature leakage current of the device.

The above content only involves preferred embodiments of the present disclosure, and the embodiments do not intend to limit the present disclosure. For those skilled in the art, the present disclosure may have various changes and variations. Any amendment, equivalent replacement, improvement, and the like made within the spirit and principle of the present disclosure shall all be included in the protection scope of the present disclosure. Although the embodiments disclosed in the present disclosure are as above, the embodiments are described for better understanding of the present disclosure, rather than for limiting the present disclosure. Any person skilled in the art can make any amendment and change to the implementation forms and details without departing from the spirit and scope disclosed by the present disclosure, but the protection scope of the present disclosure shall still be determined by the scope as defined in the claims.

The invention claimed is:

1. A reverse-conducting IGBT chip, comprising:
   a first conductive type substrate;
   a first conductive type drift layer above the substrate, wherein the drift layer comprises a cell region and a terminal region around the cell region;
   a second conductive type collector region below the substrate; and
   several first conductive type short circuit regions which are provided at an interval below the substrate and are adjacent to the collector region,
   wherein the short circuit region is located outside a first preset range having a center of the chip as a center; in a second preset range outside the first preset range and having the center of the chip as a center, a ratio of a total area of the short circuit regions to an area of the collector region is a first preset threshold value; in a third preset range outside the second preset range and having the center of the chip as a center, a ratio of a total area of the short circuit regions to an area of the collector region is a second preset threshold value; in a range outside the third preset range and enclosed by a chip edge, a ratio of a total area of the short circuit regions to an area of the collector region is a third preset threshold value; and the first preset threshold value is less than the second preset threshold value, and the second preset threshold value is less than the third preset threshold value;
   wherein a size of the first preset range is selected to be able to eliminate a primary voltage snap-back phenomenon of the chip;
   wherein a size of the second preset range and a size of the third preset range, as well as the first preset threshold value, the second preset threshold value, and the third preset threshold value are selected to able to eliminate a secondary voltage snap-back phenomenon of the chip;
   wherein the first preset threshold value is in a range from 0.1 to 0.3;
   wherein the second preset threshold value is calculated by the following calculation formula:

$$s = K \times r$$

where s is the second preset threshold value, K is a constant number, which is in a range from 1.1 to 2.0, and r is the first preset threshold; and
   wherein the third preset threshold value is calculated by the following calculation formula:

$$t = K^2 \times r$$

where t is the third preset threshold value.

2. The reverse-conducting IGBT chip according to claim 1, wherein
   the chip is a chip of a square; and
   each of the first preset range, the second preset range, and the third preset range has a shape of a square.

3. The reverse-conducting IGBT chip according to claim 2, wherein
   a side length of the first preset range is calculated by the following calculation formula:

$$a = 2W = 2 \times C \times \sqrt{L \times Q/ND},$$

wherein a is the side length of the first preset range; W is a half of the side length of the first preset range; C is a constant number, and is in a range from $\sqrt{3}$ to $2\sqrt{2}$; L is a thickness of the chip; Q is an ion implantation dosage of the substrate; and ND is an ion doping concentration of the drift layer;
   a side length of the second preset range is calculated by the following calculation formula:

$$b = 2\left(W + \frac{X - W}{3}\right),$$

wherein b is the side length of the second preset range, and X is a half of a side length of the chip; and
   a side length of the third preset range is calculated by the following calculation formula:

$$c = 2\left(W + \frac{X - W}{3} \times 2\right),$$

wherein c is the side length of the third preset range.

4. The reverse-conducting IGBT chip according to claim 2, wherein
   a side length of the first preset range is calculated by the following calculation formula:

$$a = 2W = 2 \times C \times \sqrt{L \times Q/ND},$$

wherein a is the side length of the first preset range; W is a half of the side length of the first preset range; C is a constant number, and is in a range from $\sqrt{3}$ to $2\sqrt{2}$; L is a thickness of the chip; Q is an ion implantation dosage of the substrate; and ND is an ion doping concentration of the drift layer;

a side length of the second preset range is calculated by the following calculation formula:

$$b = 2\left(W + \frac{X-W}{2}\right),$$

wherein b is the side length of the second preset range, and X is a half of a side length of the chip; and a side length of the third preset range is calculated by the following calculation formula:

$$c = 2\left(W + \frac{X-W}{2} + \frac{X-W}{3}\right),$$

wherein c is the side length of the third preset range.

5. The reverse-conducting IGBT chip according to claim 1, wherein the chip is a chip of a square; and each of the first preset range, the second preset range, and the third preset range is circular.

6. The reverse-conducting IGBT chip according to claim 5, wherein a radius of the first preset range is calculated by the following calculation formula:

$$W = C \times \sqrt{L \times Q / ND},$$

wherein W is the radius of the first preset range; C is a constant number, and is in a range from $\sqrt{3}$ to $2\sqrt{2}$; L is a thickness of the chip; Q is an ion implantation dosage of the substrate; and ND is an ion doping concentration of the drift layer;

a radius of the second preset range is calculated by the following calculation formula:

$$b = W + \frac{X-W}{3},$$

wherein b is the radius of the second preset range, and X is a half of a side length of the chip; and a radius of the third preset range is calculated by the following calculation formula:

$$c = W + \frac{X-W}{3} \times 2,$$

wherein c is the radius of the third preset range.

7. The reverse-conducting IGBT chip according to claim 5, wherein a radius of the first preset range is calculated by the following calculation formula:

$$W = C \times \sqrt{L \times Q / ND},$$

wherein W is the radius of the first preset range; C is a constant number, and is in a range from $\sqrt{3}$ to $2\sqrt{2}$; L is a thickness of the chip; Q is an ion implantation dosage of the substrate; and ND is an ion doping concentration of the drift layer;

a radius of the second preset range is calculated by the following calculation formula:

$$b = W + \frac{X-W}{2},$$

wherein b is the radius of the second preset range, and X is a half of a side length of the chip; and a radius of the third preset range is calculated by the following calculation formula:

$$c = W + \frac{X-W}{2} + \frac{X-W}{3},$$

wherein c is the radius of the third preset range.

* * * * *